(12) United States Patent
Lin et al.

(10) Patent No.: US 8,148,822 B2
(45) Date of Patent: Apr. 3, 2012

(54) BONDING PAD ON IC SUBSTRATE AND METHOD FOR MAKING THE SAME

(75) Inventors: Mou-Shiung Lin, Hsin-Chu (TW); Hsin-Jung Lo, Taipei County (TW); Chiu-Ming Chou, Kaohsiung (TW); Chien-Kang Chou, Tainan Hsien (TW); Ke-Hung Chen, Kao-Hsiung (TW)

(73) Assignee: Megica Corporation, Hsinchu (TW)

( * ) Notice: Subject to any disclaimer, the term of this patent is extended or adjusted under 35 U.S.C. 154(b) by 376 days.

(21) Appl. No.: 11/383,762

(22) Filed: May 17, 2006

(65) Prior Publication Data
US 2007/0023919 A1    Feb. 1, 2007

Related U.S. Application Data

(60) Provisional application No. 60/703,933, filed on Jul. 29, 2005, provisional application No. 60/703,932, filed on Jul. 29, 2005.

(51) Int. Cl.
*H01L 23/52* (2006.01)
*H01L 21/44* (2006.01)

(52) U.S. Cl. ......................... 257/763; 438/656

(58) Field of Classification Search .............. 257/741, 257/761–770, E21.591–E21.596; 438/656
See application file for complete search history.

(56) References Cited

U.S. PATENT DOCUMENTS

| | | | |
|---|---|---|---|
| 5,134,460 A * | 7/1992 | Brady et al. ............... | 257/737 |
| 5,795,833 A | 8/1998 | Yu | |
| 6,472,304 B2 | 10/2002 | Chittipedi et al. | |
| 6,753,259 B2 | 6/2004 | Jang et al. | |
| 7,470,997 B2 | 12/2008 | Lin | |
| 7,592,246 B2 * | 9/2009 | Akram ......................... | 438/612 |
| 2001/0052644 A1* | 12/2001 | Howell et al. ............... | 257/698 |
| 2003/0189261 A1 | 10/2003 | Tong | |
| 2003/0222295 A1 | 12/2003 | Lin | |
| 2004/0007779 A1 | 1/2004 | Arbuthnot | |
| 2004/0070042 A1 | 4/2004 | Lee | |
| 2005/0098605 A1* | 5/2005 | Edelstein et al. .............. | 228/4.5 |
| 2005/0167837 A1 | 8/2005 | Cheng | |
| 2006/0091536 A1 | 5/2006 | Huang | |
| 2006/0202346 A1 | 9/2006 | Shih | |

(Continued)

FOREIGN PATENT DOCUMENTS

CN    1314225 A    9/2001

(Continued)

OTHER PUBLICATIONS

Hong, Xiao: "Introduction to Semiconductor Manufacturing Technology," 2001 p. 612 and pp. 624-628.

(Continued)

*Primary Examiner* — Calvin Lee
(74) *Attorney, Agent, or Firm* — McDermott Will & Emery LLP

(57) ABSTRACT

A bonding pad structure is fabricated on an integrated circuit (IC) substrate having at least a contact layer on its top surface. A passivation layer covers the top surface of the IC substrate and the contact layer. The passivation layer has an opening exposing a portion of the contact layer. An electrically conductive adhesion/barrier layer directly is bonded to the contact layer. The electrically conductive adhesion/barrier layer extends to a top surface of the passivation layer. A bonding metal layer is stacked on the electrically conductive adhesion/barrier layer.

32 Claims, 13 Drawing Sheets

U.S. PATENT DOCUMENTS

2007/0042596 A1  2/2007  McTeer

FOREIGN PATENT DOCUMENTS

| CN | 1574345 A | 2/2005 |
|---|---|---|
| TW | 444288 | 7/2001 |
| TW | 468245 | 12/2001 |
| TW | 469591 | 12/2001 |
| TW | 494510 | 7/2002 |
| TW | 531873 | 5/2003 |
| TW | 586208 | 5/2004 |
| TW | 200426990 | 12/2004 |
| TW | I225288 | 12/2004 |
| TW | I229930 | 3/2005 |
| TW | I236722 | 7/2005 |

OTHER PUBLICATIONS

Search Report for Taiwan Application No. 095127947 dated Dec. 29, 2009 with English Translation.

Search Report for Taiwan Application No. 095127948 dated Dec. 30, 2009 with English Translation.

Search Report for Taiwan Patent Application No. 095127948 dated Jun. 25, 2010, with English Translation.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Search Report for Taiwan Patent Application No. 095127947 dated Jun. 26, 2010, with English Translation.

Decision for Taiwan Patent Application No. 095127947 dated Mar. 15, 2011, with English Translation.

* cited by examiner

BONDING PAD ON IC SUBSTRATE AND METHOD FOR MAKING THE SAME

CROSS REFERENCE TO RELATED APPLICATIONS

This application claims the benefits of U.S. provisional application No. 60/703,933, filed Jul. 29, 2005. This application also claims the benefits of U.S. provisional application No. 60/703,932, filed Jul. 29, 2005.

BACKGROUND OF THE INVENTION

1. Field of the Invention

The invention relates to the fabrication of semiconductor devices and, more particularly, to a novel bonding pad structure on IC substrate and a manufacturing method thereof, which is particularly compatible with wire bonding, tape automated bonding (TAB), chip-on-film (COF) bonding or chip-on-glass (COG) bonding processes.

2. Description of the Prior Art

The reduction of the feature sizes of semiconductor devices using state-of-the-art semiconductor techniques have dramatically increased the device packing density of a single integrated circuit (IC) chip. However, as the device packing density increases, it is necessary to increase the number of electrical metal interconnect layers on the IC chip to effectively wire up the discrete devices on a substrate while reducing the chip size. For example, having two to six levels of metal interconnect layers in a single IC chip is a commonplace in this field.

After completing the multilevel interconnect structure, bonding pads are formed on the top surface of the interconnect structure to provide external electrical connections to the chip or die. A passivation layer is applied, such as silicon oxide, silicon nitride, silicon oxy-nitride or a combination thereof to protect the chip from moisture and contamination. After the passivation layer is formed, die containing a plurality of circuit patterns is connected to a package substrate. The package substrate may have a plurality of pins for connecting the circuitry to an external printed circuit board.

One method for forming electrical connections between the die and the package substrate is wire bonding. A corresponding set of contacts is located on the package substrate. A connecting wire is bonded to connect each bonding pad to a respective contact on the package substrate, using a method such as ultrasonic bonding. Following wire bonding, the package is encapsulated and sealed.

The reliability of the bonding process is particularly critical since the bonding process occurs so late in the production cycle. Die being packaged have typically already been tested and sorted. Any problems in the wire bonding process thus impact only good die. Secure, reliable bonding of the wire to the bonding pad requires that the bonding pad be formed of metals compatible with the bonding process. Aluminum and aluminum alloys are typically employed to achieve the most reliable bonds.

To prevent the shifting of bonding wires during the step of injecting the plastic material or the lengthening of the bonding wires, the bonding pads have been disposed on the peripheral of the chips. Therefore, longer conductive traces are needed to connect the device to the bonding pads. As the trend of chip advances toward higher speeds and higher capabilities, the number of I/O connections rapidly increases. However, the high inductance created in the connection of bonding pads and bonding wires obstructs the high-speed operation of the chips.

SUMMARY OF THE INVENTION

It is one object of the present invention to provide a novel multi-layer bonding pad or bump structure directly bonded to a copper pad or layer of an IC substrate, which is particularly compatible with standard wire bonding, tape automated bonding (TAB), chip-on-film (COF) bonding, or chip-on-glass (COG) bonding processes.

According to the claimed invention, a bonding pad structure is disclosed. The bonding pad structure is fabricated on an integrated circuit (IC) substrate having at least a contact layer on its top surface. A passivation layer covers the top surface of the IC substrate and the contact layer. The passivation layer has an opening exposing a portion of the contact layer. An electrically conductive adhesion/barrier layer directly is bonded to the contact layer. The electrically conductive adhesion/barrier layer extends to a top surface of the passivation layer. A bonding metal layer is stacked on the electrically conductive adhesion/barrier layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

This invention pertains to the use of an embossing process to form a novel multi-layer bonding pad or bump structure directly bonded to a copper pad or aluminum layer of an IC substrate, which is particularly compatible with standard wire bonding, tape automated bonding (TAB), chip-on-film (COF) bonding, or chip-on-glass (COG) bonding processes.

Figure 1:
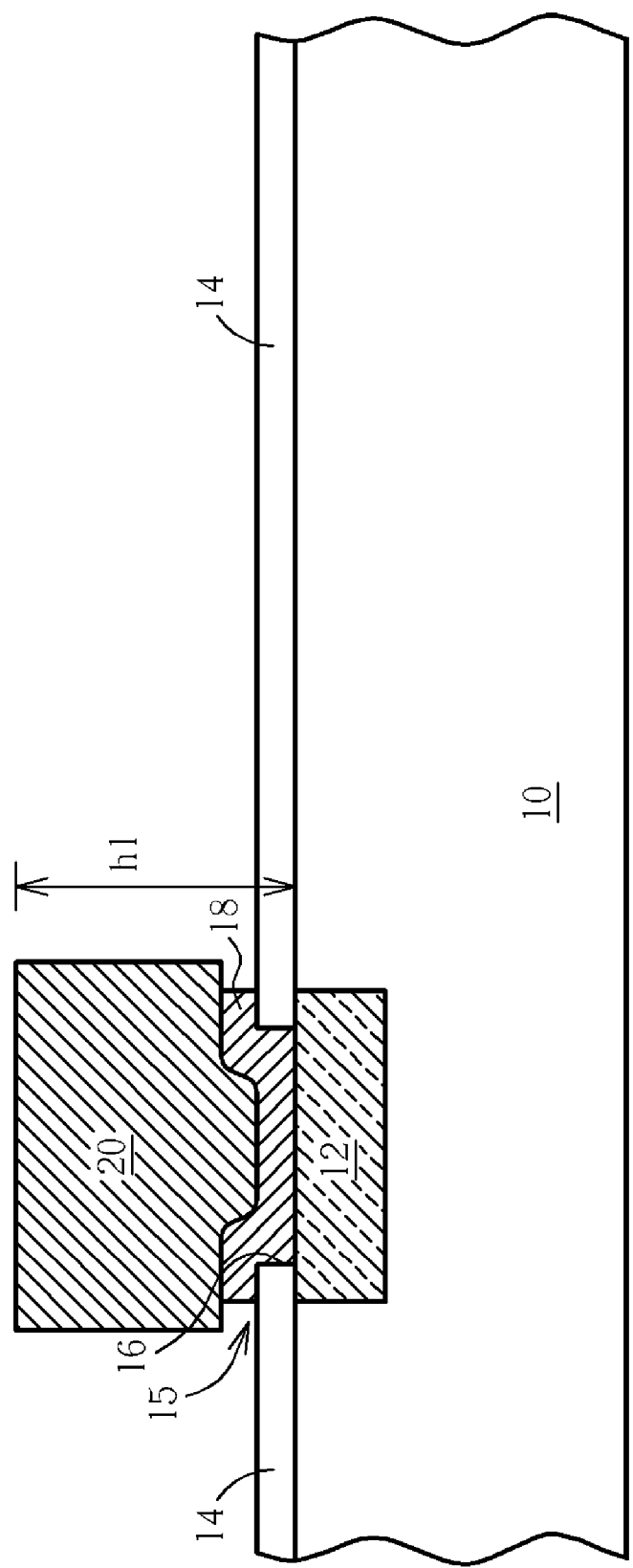
FIG. 1 is a schematic, cross-sectional diagram illustrating a gold bonding pad structure in accordance with the first preferred embodiment of this invention.

Please refer to FIG. 1. FIG. 1 is a schematic, cross-sectional diagram illustrating a gold bonding pad structure in accordance with a first preferred embodiment of this invention. As shown in FIG. 1, an integrated circuit (IC) substrate 10 is provided. The IC substrate 10 comprises therein a plurality of circuit components such as, for example, transistors, memory and/or logic devices, dielectric layers and multilevel interconnection that communicates with the respective circuit components, which are not shown for the sake of simplicity.

An inlaid copper contact pad 12 is formed at the top surface of the IC substrate 10. In other embodiments, the inlaid copper contact pad 12 may be replaced with an aluminum layer. The inlaid copper contact pad 12 is part of the top metal layer of the multilevel interconnection of the IC substrate 10 and is electrically connected with the underlying integrated circuit. The inlaid copper contact pad 12 may be formed by conventional damascene process generally including the step of etching a trench opening into an insulating layer, filling the trench opening with copper, and then removing excess copper outside the trench opening by using a conventional chemical mechanical polishing (CMP) process.

A diffusion barrier (not shown) may be formed to encapsulate the inlaid copper contact pad 12 in order to prevent copper from diffusing into the IC substrate 10. Suitable materials for the diffusion barrier may include, but not limited to, tantalum (Ta), tantalum nitride (TaN), cobalt (Co), nickel (Ni), tungsten (W), tungsten nitride (WN), niobium (Nb), aluminum silicate, titanium nitride (TiN) and TiSiN.

The insulating layer surrounding the inlaid copper contact pad 12 includes, but not limited to, low-k (k<3.0) or ultra low-k (k<2.2) dielectric materials. By way of example, the aforesaid low-k dielectric materials may comprise SiLK™, Black Diamond™, polyarylene ether, polyarylene, polybenzoxazole, porous silicon oxide and spin-on dielectrics with a $Si_wC_xO_yH_z$ composition.

A passivation layer 14 covers the top surface of the IC substrate 10 including the inlaid copper contact pad 12. As can be seen in FIG. 1, the top surface of the inlaid copper contact pad 12 is approximately coplanar with the top surface of the IC substrate 10. The inlaid copper contact pad 12 is partially exposed by an opening 16 that is formed in the passivation layer 14.

According to this preferred embodiment, the passivation layer 14 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

Typically, the opening 16 has a dimension of about 0.5-15 micrometers. In another case, the opening 16 may range between 15 and 300 micrometers.

An electrically conductive adhesion/barrier layer 18 is directly bonded to the inlaid copper contact pad 12 and extends to the top surface of the passivation layer 14. As can be seen in FIG. 1, the electrically conductive adhesion/barrier layer 18, which contours the top surface of the passivation layer 14 and sidewalls of the opening 16, seals the opening 16 and prevents the inlaid copper contact pad 12 from contacting with the air. Preferably, the electrically conductive adhesion/barrier layer 18 has a thickness ranging between 0.1 micrometer and 10 micrometers.

According to this preferred embodiment, the electrically conductive adhesion/barrier layer 18 comprises titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof, or composite layer of the above-described materials. The metal suited for the electrically conductive adhesion/barrier layer 18 may be deposited by using electroplating, electroless, chemical vapor deposition (CVD) or physical vapor deposition (PVD) methods.

A bonding metal layer 20 is disposed on the electrically conductive adhesion/barrier layer 18. A gap or undercut 15 is formed between a bottom surface of the bonding metal layer 20 and the top surface of the passivation layer 14. According to this preferred embodiment, suitable materials for the bonding metal layer 20 include gold (Au), silver (Ag), palladium (Pd), platinum (Pt), rhodium (Rh), ruthenium (Ru), rhenium (Re), SnPb, SnAg, or alloys thereof, or composite layers of the above-described metals.

The metal suited for the bonding metal layer 20 may be deposited by using electroplating, electroless, chemical vapor deposition (CVD) or physical vapor deposition (PVD) methods. Preferably, the bonding metal layer 20 is made of electroplating or electroless Au and is particularly suites for the wire bonding process, TAB process, COF process and COG process.

The total thickness $h_1$, which is combination of the thickness of the bonding metal layer 20 and the thickness of the underlying electrically conductive adhesion/barrier layer 18, may range between 2 and 30 micrometers, preferably 2-15 micrometers for wire bonding applications, and 8-30 micrometers for TAB, COF or COG applications.

Figure 2:
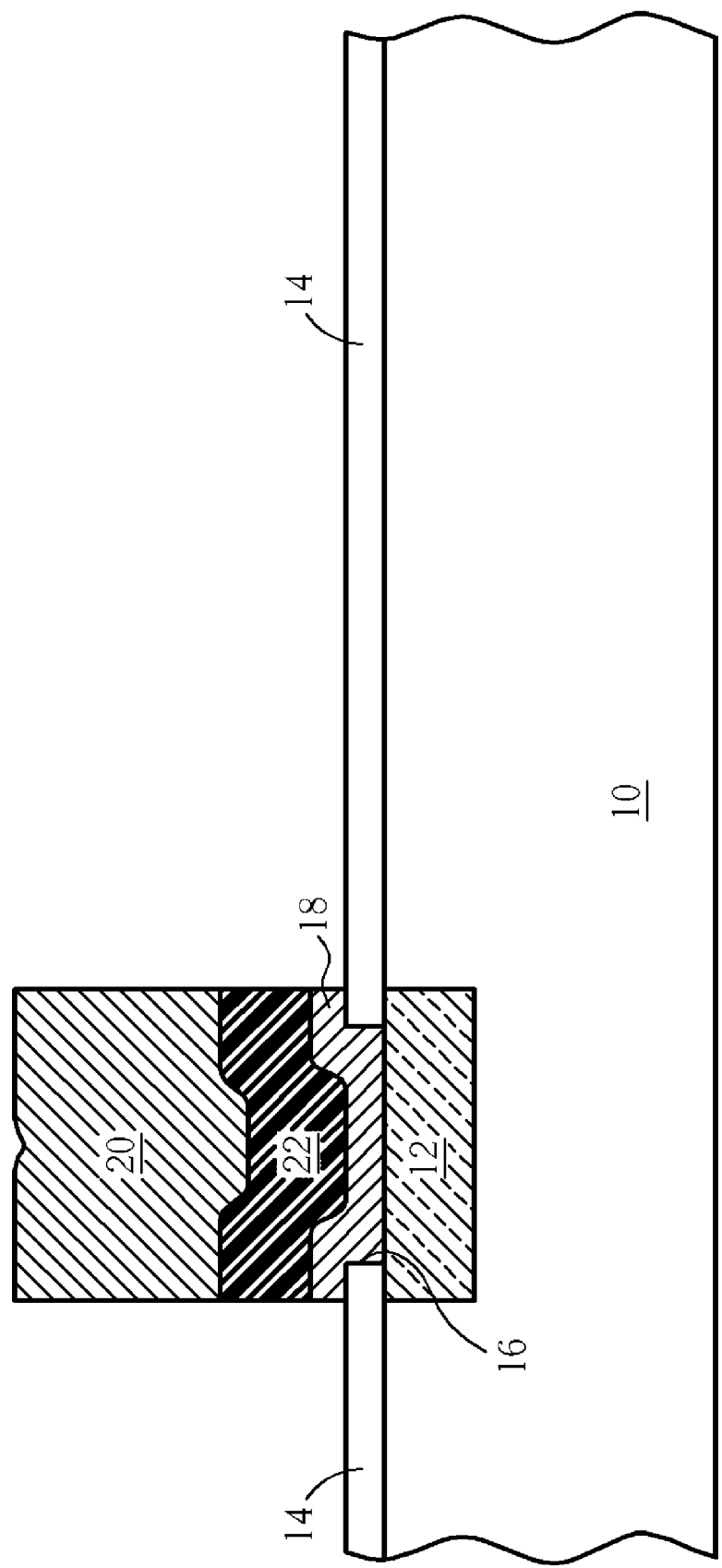
FIG. 2 is a schematic, cross-sectional diagram illustrating a gold bonding pad structure in accordance with the second preferred embodiment of this invention.

Please refer to FIG. 2. FIG. 2 is a schematic, cross-sectional diagram illustrating a gold bonding pad structure in accordance with another preferred embodiment of this invention, wherein like numeral numbers designate like elements, layers or regions. As shown in FIG. 2, an IC substrate 10 is provided. Likewise, the IC substrate 10 comprises therein a plurality of circuit components such as, for example, transistors, memory and/or logic devices, dielectric layers and multilevel interconnection that communicates with the respective circuit components, which are not shown for the sake of simplicity.

An inlaid copper contact pad 12 is formed at the top surface of the IC substrate 10. In other embodiments, the inlaid copper contact pad 12 may be replaced with an aluminum layer. The inlaid copper contact pad 12 is part of the top metal layer of the multilevel interconnection of the IC substrate 10 and is electrically connected with the underlying integrated circuit. The inlaid copper contact pad 12 may be formed by conventional damascene process generally including the step of etching a trench opening into an insulating layer, filling the trench opening with copper, and then removing excess copper outside the trench opening by using a conventional CMP process.

Typically, a diffusion barrier (not shown) is deposited on interior surface of the trench opening to encapsulate the inlaid copper contact pad 12 in order to prevent copper from diffusing into the IC substrate 10. Suitable materials for the diffusion barrier may include, but not limited to, tantalum (Ta), tantalum nitride (TaN), cobalt (Co), nickel (Ni), tungsten (W), tungsten nitride (WN), niobium (Nb), aluminum silicate, titanium nitride (TiN) and TiSiN.

The insulating layer surrounding the inlaid copper contact pad 12 includes, but not limited to, low-k (k<3.0) or ultra low-k (k<2.2) dielectric materials. By way of example, the aforesaid low-k dielectric materials may comprise SiLK™, Black Diamond™, polyarylene ether, polyarylene, polybenzoxazole, porous silicon oxide and spin-on dielectrics with a $Si_wC_xO_yH_z$ composition.

A passivation layer 14 covers the top surface of the IC substrate 10 including the inlaid copper contact pad 12. The top surface of the inlaid copper contact pad 12 is approximately coplanar with the top surface of the IC substrate 10. The inlaid copper contact pad 12 is partially exposed by an opening 16 that is formed in the passivation layer 14.

According to this preferred embodiment, the passivation layer 14 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

Typically, the opening 16 has a dimension of about 0.5-15 micrometers. In another case, the diameter of the opening 16 may range between 15 and 300 micrometers.

An electrically conductive adhesion/barrier layer 18 is directly bonded to the inlaid copper contact pad 12 and extends to the top surface of the passivation layer 14. The electrically conductive adhesion/barrier layer 18, which contours the top surface of the passivation layer 14 and sidewalls of the opening 16, seals the opening 16 and prevents the inlaid copper contact pad 12 from contacting with the air. Preferably, the electrically conductive adhesion/barrier layer 18 has a thickness ranging between 0.1 micrometer and 10 micrometers.

An intermediate metal layer 22 is disposed on the electrically conductive adhesion/barrier layer 18. According to this preferred embodiment, the intermediate metal layer 22 is made of nickel (>95% wt.). Preferably, the intermediate metal layer 22 has a thickness of about 0.1-10 micrometers.

A bonding metal layer 20 is disposed on the intermediate metal layer 22. According to this preferred embodiment, suitable materials for the bonding metal layer 20 include gold (Au), silver (Ag), palladium (Pd), platinum (Pt), rhodium (Rh), ruthenium (Ru), rhenium (Re), SnPb, SnAg, or alloys thereof, or composite layers of the above-described metals. Preferably, the bonding metal layer 20 is made of gold. In this case, nickel acts as a strong diffusion barrier and avoids the formation of eutectic inter-metal compounds. On the other hand, nickel also prevents the surface oxidation during gold plating.

The metal suited for the bonding metal layer 20 may be deposited by using electroplating, electroless, chemical vapor deposition (CVD) or physical vapor deposition (PVD) methods. Preferably, the bonding metal layer 20 is made of electroplating or electroless Au and is particularly suites for the wire bonding process, TAB process, COF process and COG process.

Figure 3:
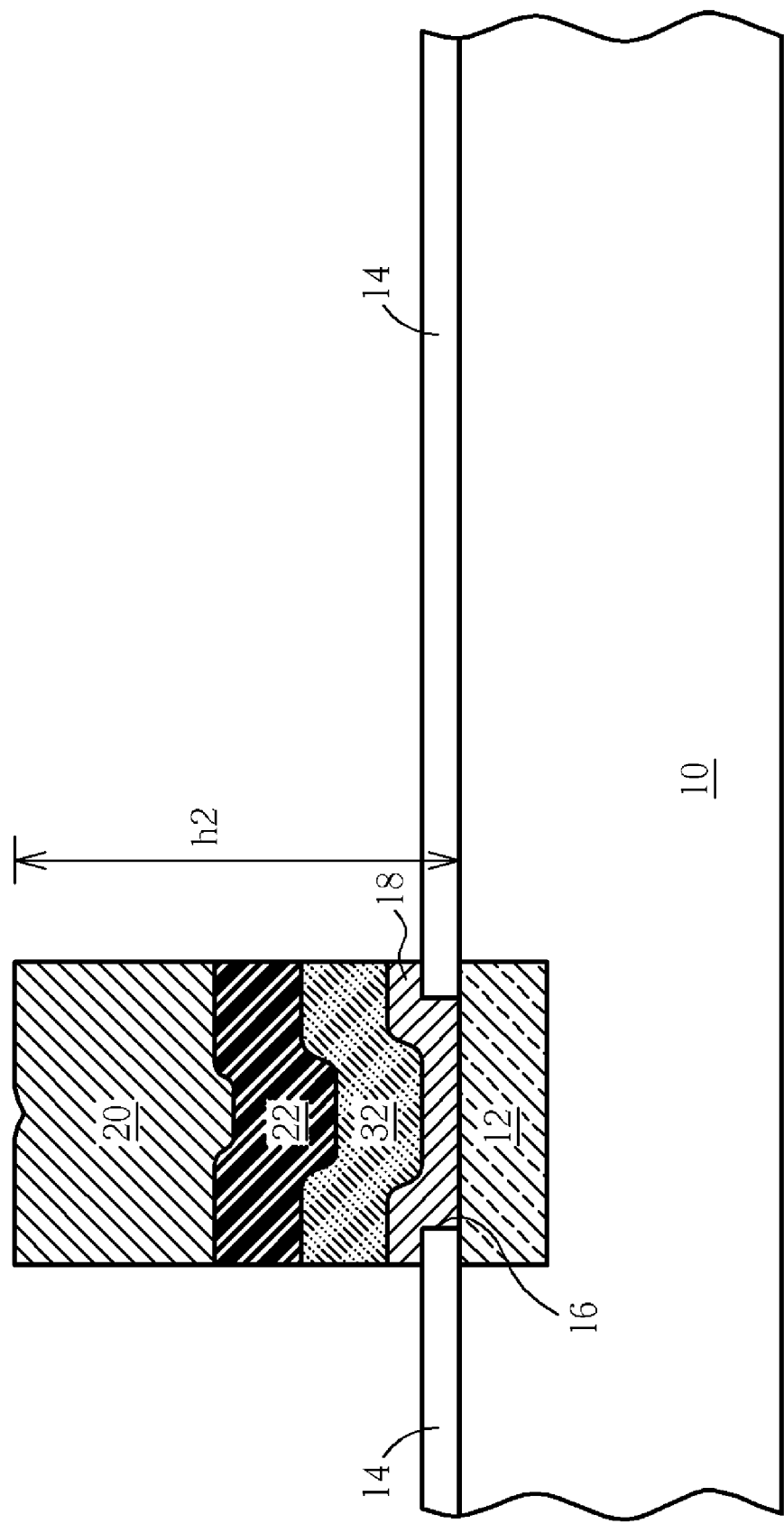
FIG. 3 is a schematic, cross-sectional diagram illustrating a gold bonding pad structure in accordance with the third preferred embodiment of this invention.

Please refer to FIG. 3. FIG. 3 is a schematic, cross-sectional diagram illustrating a gold bonding pad structure in accordance with another preferred embodiment of this invention, wherein like numeral numbers designate like elements, layers or regions. As shown in FIG. 3, an IC substrate 10 is provided. Likewise, the IC substrate 10 comprises therein a plurality of circuit components such as, for example, transistors, memory and/or logic devices, dielectric layers and multilevel interconnection that communicates with the respective circuit components, which are not shown for the sake of simplicity.

An inlaid copper contact pad 12 is formed at the top surface of the IC substrate 10. In other embodiments, the inlaid copper contact pad 12 may be replaced with an aluminum layer. The inlaid copper contact pad 12 is part of the top metal layer of the multilevel interconnection of the IC substrate 10 and is electrically connected with the underlying integrated circuit.

The insulating layer surrounding the inlaid copper contact pad 12 may include low-k (k<3.0) or ultra low-k (k<2.2) dielectric materials. By way of example, the aforesaid low-k dielectric materials may comprise SiLK™, Black Diamond™, polyarylene ether, polyarylene, polybenzoxazole, porous silicon oxide and spin-on dielectrics with a $Si_wC_xO_yH_z$ composition.

A passivation layer 14 covers the top surface of the IC substrate 10 including the inlaid copper contact pad 12. The top surface of the inlaid copper contact pad 12 is approximately coplanar with the top surface of the IC substrate 10. The inlaid copper contact pad 12 is partially exposed by an opening 16 that is formed in the passivation layer 14. The opening 16 has a dimension of about 0.5-300 micrometers.

According to this preferred embodiment, the passivation layer 14 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

An electrically conductive adhesion/barrier layer 18 is directly bonded to the inlaid copper contact pad 12 and extends to the top surface of the passivation layer 14. The electrically conductive adhesion/barrier layer 18, which contours the top surface of the passivation layer 14 and sidewalls of the opening 16, seals the opening 16 and prevents the inlaid copper contact pad 12 from contacting with the air. Preferably, the electrically conductive adhesion/barrier layer 18 has a thickness ranging between 0.1 micrometer and 10 micrometers.

A first intermediate metal layer 32 is disposed on the electrically conductive adhesion/barrier layer 18. According to this preferred embodiment, the first intermediate metal layer 32 is made of copper (>95% wt.). The first intermediate metal layer 32 has a thickness of about 0.1-10 micrometers.

A second intermediate metal layer 22 is disposed on the first intermediate metal layer 32. According to this preferred embodiment, the second intermediate metal layer 22 is made of nickel (>95% wt.). The second intermediate metal layer 22 has a thickness of about 0.1-10 micrometers.

A bonding metal layer 20 is disposed on the second intermediate metal layer 22. According to this preferred embodiment, suitable materials for the bonding metal layer 20 include gold (Au), silver (Ag), palladium (Pd), platinum (Pt), rhodium (Rh), ruthenium (Ru), rhenium (Re), SnPb, SnAg, or alloys thereof, or composite layers of the above-described metals. Preferably, the bonding metal layer 20 is made of gold. In this case, nickel layer 22 acts as a strong diffusion barrier. Nickel layer 22 also prevents the surface oxidation of the copper layer 32.

The metal suited for the bonding metal layer 20 may be deposited by using electroplating, electroless, chemical vapor deposition (CVD) or physical vapor deposition (PVD) methods. Preferably, the bonding metal layer 20 is made of electroplating or electroless Au and is particularly suites for the wire bonding process, TAB process, COF process and COG process. The thickness of the bonding metal layer 20 may range between 2 and 30 micrometers. According to this embodiment, the total thickness $h_2$ may range between 30 and 300 micrometers.

Figure 4:
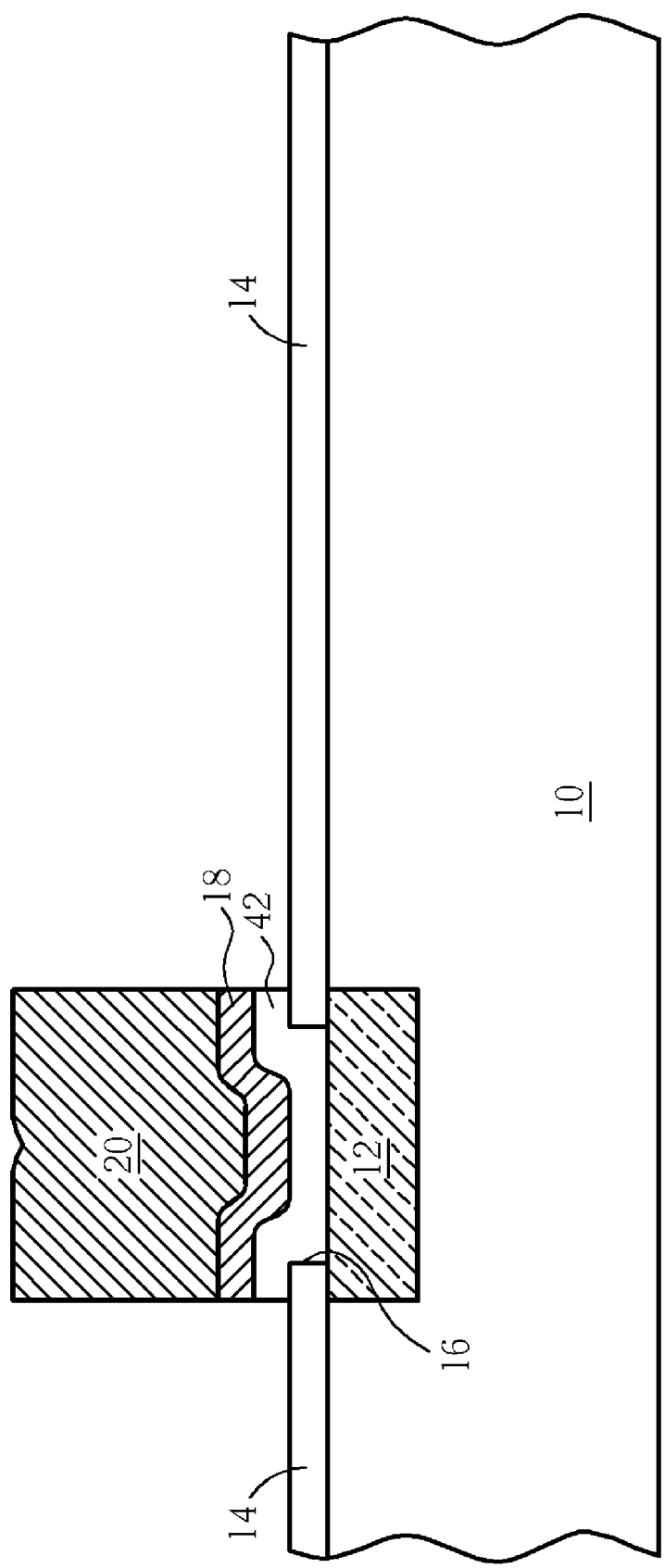
FIG. 4 is a schematic, cross-sectional diagram illustrating a gold bonding pad structure in accordance with the fourth preferred embodiment of this invention.

Please refer to FIG. 4. FIG. 4 is a schematic, cross-sectional diagram illustrating a gold bonding pad structure in accordance with another preferred embodiment of this invention.

As shown in FIG. 4, an IC substrate 10 is provided. The IC substrate 10 comprises therein a plurality of circuit components such as, for example, transistors, memory and/or logic devices, dielectric layers and multilevel interconnection that communicates with the respective circuit components, which are not shown for the sake of simplicity.

An inlaid copper contact pad 12 is formed at the top surface of the IC substrate 10. In other embodiments, the inlaid copper contact pad 12 may be replaced with an aluminum layer. The inlaid copper contact pad 12 is part of the top metal layer of the multilevel interconnection of the IC substrate 10 and is electrically connected with the underlying integrated circuit. The inlaid copper contact pad 12 may be formed by conventional damascene process generally including the step of etching a trench opening into an insulating layer, filling the trench opening with copper, and then removing excess copper outside the trench opening by using a conventional chemical mechanical polishing (CMP) process.

A diffusion barrier (not shown) may be formed to encapsulate the inlaid copper contact pad 12 in order to prevent copper from diffusing into the IC substrate 10. Suitable materials for the diffusion barrier may include, but are not limited to, tantalum (Ta), tantalum nitride (TaN), cobalt (Co), nickel (Ni), tungsten (W), tungsten nitride (WN), niobium (Nb), aluminum silicate, titanium nitride (TiN) & TiSiN The diffusion barrier can be under the inlaid copper contact pad 12 and at a sidewall of the inlaid copper contact pad 12.

The insulating layer surrounding the inlaid copper contact pad 12 includes, but not limited to, low-k (k<3.0) or ultra low-k (k<2.2) dielectric materials. By way of example, the aforesaid low-k dielectric materials may comprise SiLK™, Black Diamond™, polyarylene ether, polyarylene, polybenzoxazole, porous silicon oxide and spin-on dielectrics with a $Si_wC_xO_yH_z$ composition.

A passivation layer 14 covers the top surface of the IC substrate 10 including the inlaid copper contact pad 12. As can be seen in FIG. 1, the top surface of the inlaid copper contact pad 12 is approximately coplanar with the top surface of the IC substrate 10. The inlaid copper contact pad 12 is partially exposed by an opening 16 that is formed in the passivation layer 14.

According to this preferred embodiment, the passivation layer 14 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

Typically, the opening 16 has a dimension of about 0.5-15 micrometers. In another case, the opening 16 may range between 15 and 300 micrometers.

A metal cap layer 42 is directly bonded to inlaid copper contact pad 12 and extends to the top surface of the passivation layer 14. The metal cap layer 42, which contours the top surface of the passivation layer 14 and sidewalls of the opening 16, seals the opening 16 and prevents the inlaid copper contact pad 12 from contacting with the air.

According to this preferred embodiment, the metal cap layer 42 comprises aluminum (Al), gold (Au), silver (Ag), palladium (Pd), platinum (Pt), rhodium (Rh), ruthenium (Ru), rhenium (Re), SnPb, SnAg, or alloys thereof, or composite layers of the above-described metals.

In another case, a barrier layer (not explicitly shown) may be interposed between the metal cap layer 42 and the inlaid copper contact pad 12. The barrier layer may comprise titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof.

An electrically conductive adhesion/barrier layer 18 is directly bonded to the metal cap layer 42. Preferably, the electrically conductive adhesion/barrier layer 18 has a thickness ranging between 0.1 micrometer and 10 micrometers.

According to this preferred embodiment, the electrically conductive adhesion/barrier layer 18 comprises titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof, or composite layer of the above-described materials. The metal suited for the electrically conductive adhesion/barrier layer 18 may be deposited by using electroplating, electroless, chemical vapor deposition (CVD) or physical vapor deposition (PVD) methods.

A bonding metal layer 20 is disposed on the electrically conductive adhesion/barrier layer 18. According to this preferred embodiment, suitable materials for the bonding metal layer 20 include gold (Au), silver (Ag), palladium (Pd), platinum (Pt), rhodium (Rh), ruthenium (Ru), rhenium (Re), SnPb, SnAg, or alloys thereof, or composite layers of the above-described metals. Preferably, the bonding metal layer 20 is made of electroplating or electroless Au and is particularly suites for the wire bonding process, TAB process, COF process and COG process.

Figure 5:
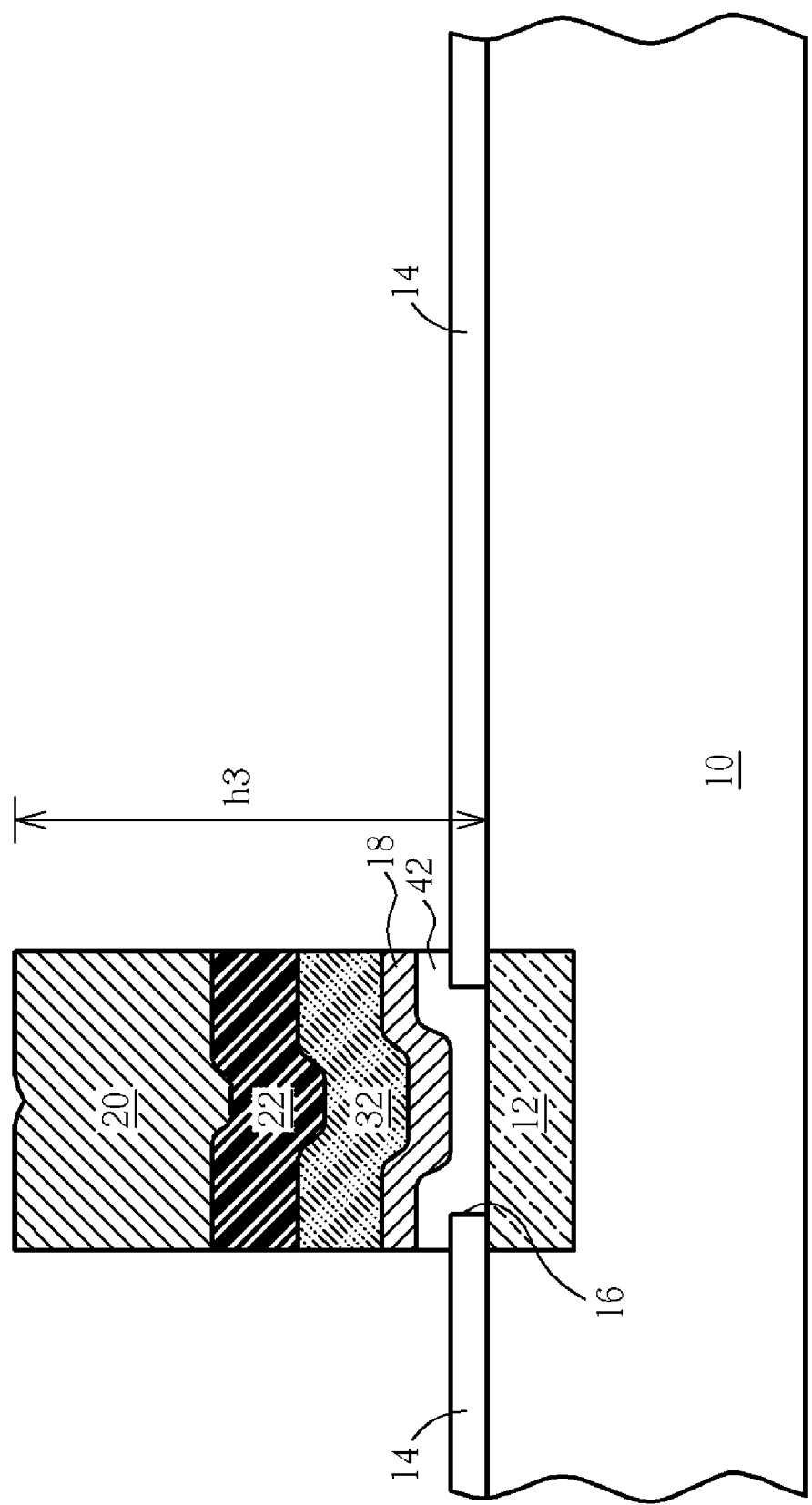
FIG. 5 is a schematic, cross-sectional diagram illustrating a gold bonding pad structure in accordance with the fifth preferred embodiment of this invention.

Please refer to FIG. 5. FIG. 5 is a schematic, cross-sectional diagram illustrating a gold bonding pad structure in accordance with another preferred embodiment of this invention. As shown in FIG. 5, an IC substrate 10 is provided. The IC substrate 10 comprises therein a plurality of circuit components such as, for example, transistors, memory and/or logic devices, dielectric layers and multilevel interconnection that communicates with the respective circuit components, which are not shown for the sake of simplicity.

An inlaid copper contact pad 12 is formed at the top surface of the IC substrate 10. In other embodiments, the inlaid copper contact pad 12 may be replaced with an aluminum layer. The inlaid copper contact pad 12 is part of the top metal layer of the multilevel interconnection of the IC substrate 10 and is electrically connected with the underlying integrated circuit. The inlaid copper contact pad 12 may be formed by conventional damascene process generally including the step of etching a trench opening into an insulating layer, filling the trench opening with copper, and then removing excess copper outside the trench opening by using a conventional chemical mechanical polishing (CMP) process.

A passivation layer 14 covers the top surface of the IC substrate 10 including the inlaid copper contact pad 12. The inlaid copper contact pad 12 is partially exposed by an opening 16 that is formed in the passivation layer 14. Typically, the opening 16 has a dimension of about 0.5-15 micrometers. In another case, the diameter of the opening 16 may range between 15 and 300 micrometers.

According to this preferred embodiment, the passivation layer 14 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

A metal cap layer 42 is directly bonded to inlaid copper contact pad 12 and extends to the top surface of the passivation layer 14. The metal cap layer 42, which contours the top surface of the passivation layer 14 and sidewalls of the opening 16, seals the opening 16 and prevents the inlaid copper contact pad 12 from contacting with the air.

According to this preferred embodiment, the metal cap layer 42 comprises aluminum (Al), gold (Au), silver (Ag), palladium (Pd), platinum (Pt), rhodium (Rh), ruthenium (Ru), rhenium (Re), SnPb, SnAg, or alloys thereof, or composite layers of the above-described metals.

An electrically conductive adhesion/barrier layer 18 is directly bonded to the metal cap layer 42. Preferably, the electrically conductive adhesion/barrier layer 18 has a thickness ranging between 0.1 micrometer and 10 micrometers.

According to this preferred embodiment, the electrically conductive adhesion/barrier layer 18 comprises titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof, or composite layer of the above-described materials.

A first intermediate metal layer 32 is disposed on the electrically conductive adhesion/barrier layer 18. According to this preferred embodiment, the first intermediate metal layer 32 is made of copper (>95% wt.). The first intermediate metal layer 32 has a thickness of about 0.1-10 micrometers.

A second intermediate metal layer 22 is disposed on the first intermediate metal layer 32. According to this preferred embodiment, the second intermediate metal layer 22 is made of nickel (>95% wt.). The second intermediate metal layer 22 has a thickness of about 0.1-10 micrometers.

A bonding metal layer 20 is disposed on the second intermediate metal layer 22. According to this preferred embodiment, suitable materials for the bonding metal layer 20 include gold (Au), silver (Ag), palladium (Pd), platinum (Pt), rhodium (Rh), ruthenium (Ru), rhenium (Re), SnPb, SnAg, or alloys thereof, or composite layers of the above-described metals. The total thickness $h_3$ may range between 2 and 30 micrometers. In another case, the total thickness $h_3$ may range between 30 and 300 micrometers, and in such case, it becomes a bonding metal post structure landing on the contact pad 12 of the IC substrate 10.

Figure 6:
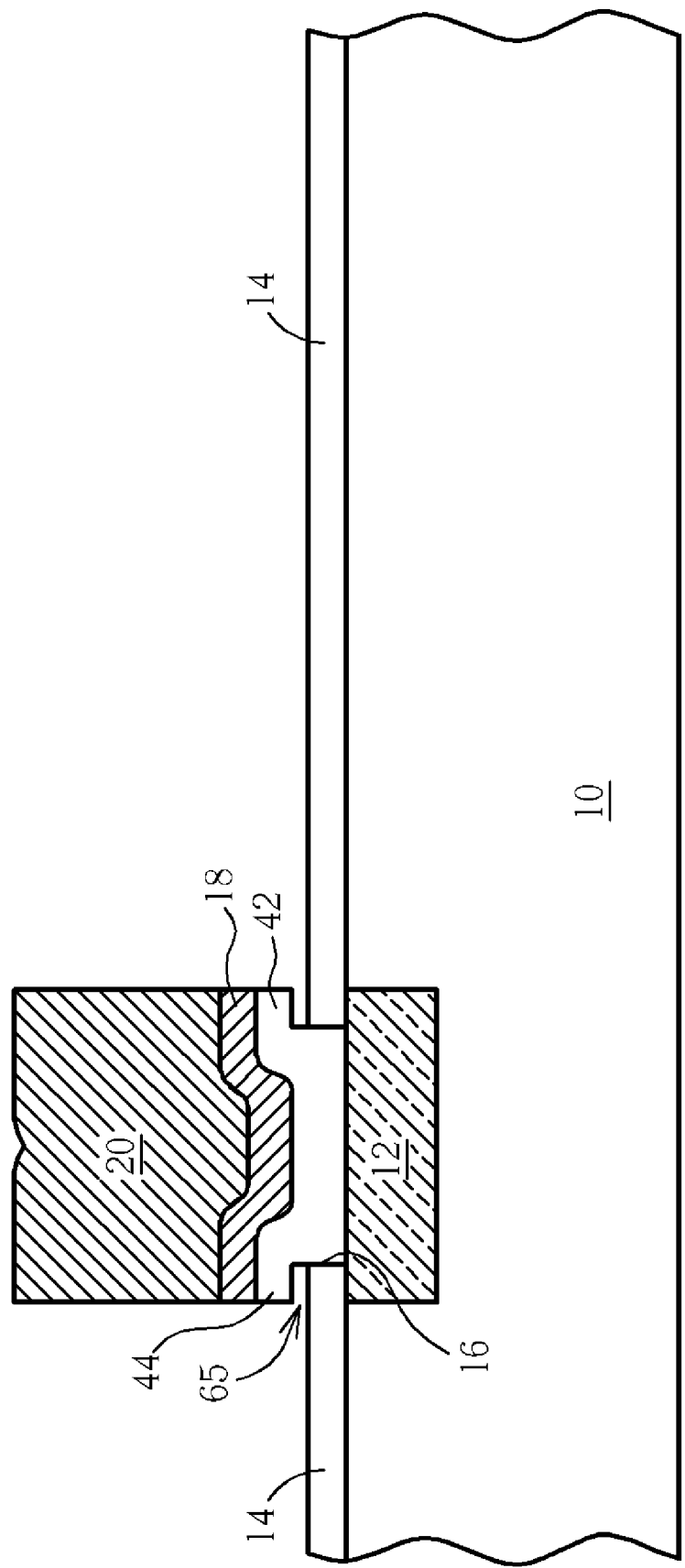
FIG. 6 is a schematic, cross-sectional diagram illustrating a gold bonding pad structure in accordance with the sixth preferred embodiment of this invention.

Please refer to FIG. 6. FIG. 6 is a schematic, cross-sectional diagram illustrating a gold bonding pad structure in accordance with another preferred embodiment of this invention. As shown in FIG. 6, an IC substrate 10 is provided. The IC substrate 10 comprises therein a plurality of circuit components such as, for example, transistors, memory and/or logic devices, dielectric layers and multilevel interconnection that communicates with the respective circuit components, which are not shown for the sake of simplicity.

An inlaid copper contact pad 12 is formed at the top surface of the IC substrate 10. In other embodiments, the inlaid copper contact pad 12 may be replaced with an aluminum layer. The inlaid copper contact pad 12 is part of the top metal layer of the multilevel interconnection of the IC substrate 10 and is electrically connected with the underlying integrated circuit. A diffusion barrier (not shown) may be formed to encapsulate the inlaid copper contact pad 12 in order to prevent copper from diffusing into the IC substrate 10. Suitable materials for the diffusion barrier may include, but not limited to, tantalum (Ta), tantalum nitride (TaN), cobalt (Co), nickel (Ni), tungsten (W), tungsten nitride (WN), niobium (Nb), aluminum silicate, titanium nitride (TiN) and TiSiN.

The insulating layer surrounding the inlaid copper contact pad 12 includes, but not limited to, low-k (k<3.0) or ultra low-k (k<2.2) dielectric materials. By way of example, the aforesaid low-k dielectric materials may comprise SiLK™, Black Diamond™, polyarylene ether, polyarylene, polybenzoxazole, porous silicon oxide and spin-on dielectrics with a $Si_wC_xO_yH_z$ composition.

A passivation layer 14 covers the top surface of the IC substrate 10 including the inlaid copper contact pad 12. As can be seen in FIG. 6, the top surface of the inlaid copper contact pad 12 is approximately coplanar with the top surface of the IC substrate 10. The inlaid copper contact pad 12 is partially exposed by an opening 16 that is formed in the passivation layer 14. Typically, the opening 16 has a dimension of about 0.5-15 micrometers.

According to this preferred embodiment, the passivation layer 14 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

A metal cap layer 42 is directly bonded to inlaid copper contact pad 12 and extends to the top surface of the passivation layer 14. The metal cap layer 42 seals the opening 16 and prevents the inlaid copper contact pad 12 from contacting with the air. The difference between the bonding pad structure of FIG. 4 and the bonding pad structure of FIG. 6 is that a gap 65 is formed between a bottom surface of the rim portion 44 of the metal cap layer 42 and the top surface of the passivation layer 14, such that the rim portion 44 of the metal cap layer 42 impends over the passivation layer 14.

According to this preferred embodiment, the metal cap layer 42 comprises aluminum (Al), gold (Au), silver (Ag), palladium (Pd), platinum (Pt), rhodium (Rh), ruthenium (Ru), rhenium (Re), SnPb, SnAg, or alloys thereof, or composite layers of the above-described metals.

In another case, a barrier layer (not explicitly shown) may be interposed between the metal cap layer 42 and the inlaid copper contact pad 12. The barrier layer may comprise titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof.

An electrically conductive adhesion/barrier layer 18 is directly bonded to the metal cap layer 42. Preferably, the electrically conductive adhesion/barrier layer 18 has a thickness ranging between 0.1 micrometer and 10 micrometers.

According to this preferred embodiment, the electrically conductive adhesion/barrier layer 18 comprises titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof, or composite layer of the above-described materials. The metal suited for the electrically conductive adhesion/barrier layer 18 may be deposited by using electroplating, electroless, chemical vapor deposition (CVD) or physical vapor deposition (PVD) methods.

A bonding metal layer 20 is disposed on the electrically conductive adhesion/barrier layer 18. According to this preferred embodiment, suitable materials for the bonding metal layer 20 include gold (Au), silver (Ag), palladium (Pd), platinum (Pt), rhodium (Rh), ruthenium (Ru), rhenium (Re), SnPb, SnAg, or alloys thereof, or composite layers of the above-described metals. Preferably, the bonding metal layer 20 is made of electroplating or electroless Au and is particularly suites for the wire bonding process, TAB process, COF process and COG process.

Figure 7:
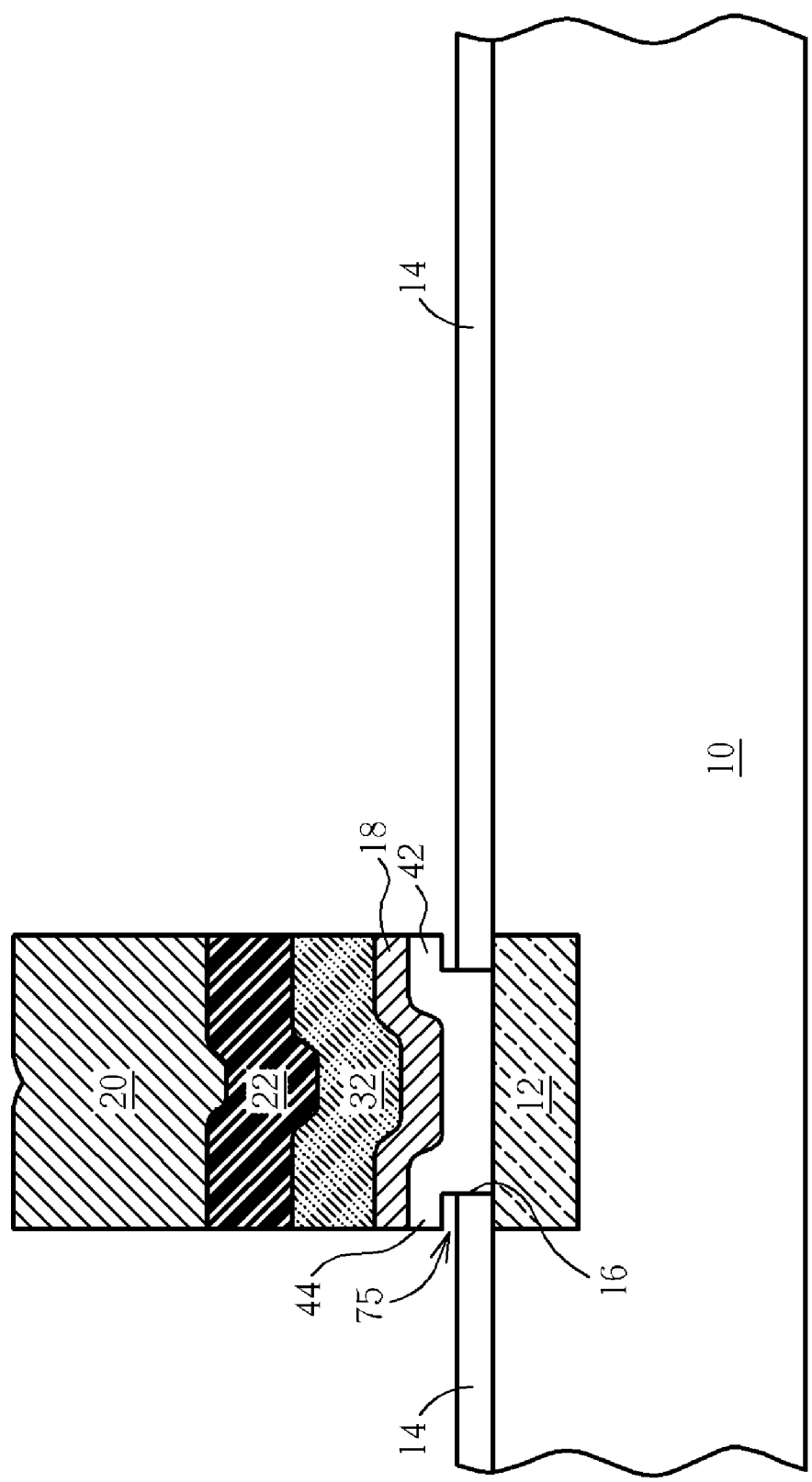
FIG. 7 is a schematic, cross-sectional diagram illustrating a gold bonding pad structure in accordance with the seventh preferred embodiment of this invention.

Please refer to FIG. 7. FIG. 7 is a schematic, cross-sectional diagram illustrating a gold bonding pad structure in accordance with another preferred embodiment of this invention. As shown in FIG. 7, an IC substrate 10 is provided. The IC substrate 10 comprises therein a plurality of circuit components such as, for example, transistors, memory and/or logic devices, dielectric layers and multilevel interconnection that communicates with the respective circuit components, which are not shown for the sake of simplicity.

An inlaid copper contact pad 12 is formed at the top surface of the IC substrate 10. In other embodiments, the inlaid copper contact pad 12 may be replaced with an aluminum layer. The inlaid copper contact pad 12 is part of the top metal layer of the multilevel interconnection of the IC substrate 10 and is electrically connected with the underlying integrated circuit. The inlaid copper contact pad 12 may be formed by conventional damascene process generally including the step of etching a trench opening into an insulating layer, filling the trench opening with copper, and then removing excess copper outside the trench opening by using a conventional chemical mechanical polishing (CMP) process.

A passivation layer 14 covers the top surface of the IC substrate 10 including the inlaid copper contact pad 12. The inlaid copper contact pad 12 is partially exposed by an opening 16 that is formed in the passivation layer 14. Typically, the opening 16 has a dimension of about 0.5-15 micrometers. In another case, the diameter of the opening 16 may range between 15 and 300 micrometers.

According to this preferred embodiment, the passivation layer 14 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

A metal cap layer 42 is directly bonded to inlaid copper contact pad 12 and extends to the top surface of the passivation layer 14. The metal cap layer 42 seals the opening 16 and prevents the inlaid copper contact pad 12 from contacting with the air. The difference between the bonding pad structure of FIG. 5 and the bonding pad structure of FIG. 7 is that a gap 75 is formed between a bottom surface of the rim portion 44 of the metal cap layer 42 and the top surface of the passivation layer 14, such that the rim portion 44 of the metal cap layer 42 impends over the passivation layer 14.

According to this preferred embodiment, the metal cap layer 42 comprises aluminum (Al), gold (Au), silver (Ag), palladium (Pd), platinum (Pt), rhodium (Rh), ruthenium (Ru), rhenium (Re), SnPb, SnAg, or alloys thereof, or composite layers of the above-described metals.

An electrically conductive adhesion/barrier layer 18 is directly bonded to the metal cap layer 42. Preferably, the electrically conductive adhesion/barrier layer 18 has a thickness ranging between 0.1 micrometer and 10 micrometers.

According to this preferred embodiment, the electrically conductive adhesion/barrier layer 18 comprises titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof, or composite layer of the above-described materials.

A first intermediate metal layer 32 is disposed on the electrically conductive adhesion/barrier layer 18. According to this preferred embodiment, the first intermediate metal layer 32 is made of copper (>95% wt.). The first intermediate metal layer 32 has a thickness of about 0.1-10 micrometers.

A second intermediate metal layer 22 is disposed on the first intermediate metal layer 32. According to this preferred embodiment, the second intermediate metal layer 22 is made of nickel (>95% wt.). The second intermediate metal layer 22 has a thickness of about 0.1-10 micrometers.

A bonding metal layer 20 is disposed on the second intermediate metal layer 22. According to this preferred embodiment, suitable materials for the bonding metal layer 20 include gold (Au), silver (Ag), palladium (Pd), platinum (Pt), rhodium (Rh), ruthenium (Ru), rhenium (Re), SnPb, SnAg, or alloys thereof, or composite layers of the above-described metals. The total thickness $h_3$ may range between 2 and 30 micrometers. In another case, the total thickness $h_3$ may range between 30 and 300 micrometers, and in such case, it becomes a bonding metal post structure landing on the contact pad 12 of the IC substrate 10.

Figure 8:
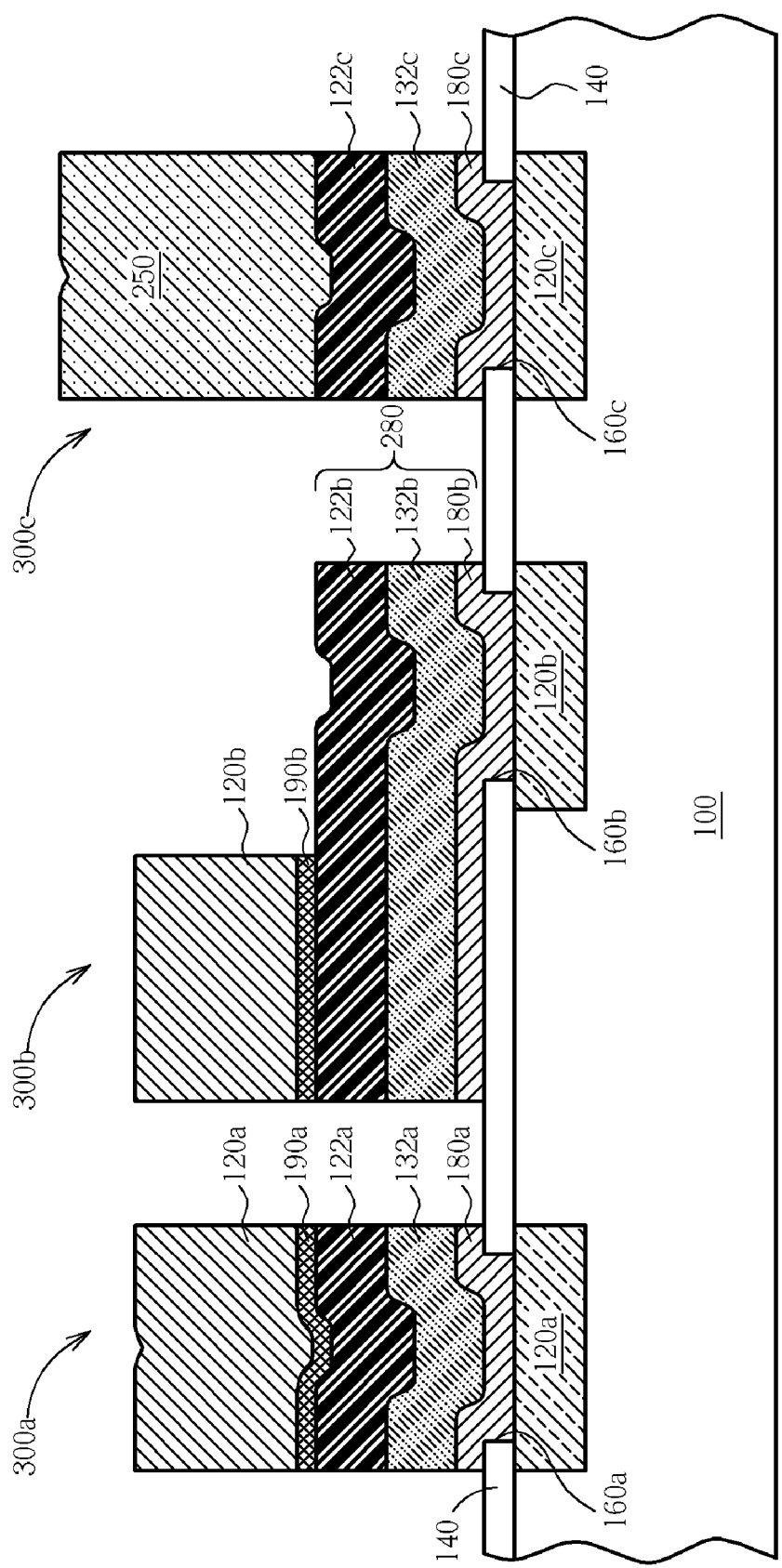
FIG. 8 is a schematic, cross-sectional diagram illustrating exemplary gold and solder bonding structures on one chip in accordance with the eighth preferred embodiment of this invention.

Please refer to FIG. 8. FIG. 8 is a schematic, cross-sectional diagram illustrating exemplary gold and solder bonding structures on one chip in accordance with another preferred embodiment of this invention. As shown in FIG. 8, an IC substrate 100 is provided. The IC substrate 100 comprises therein a plurality of circuit components such as, for example, transistors, memory and/or logic devices, dielectric layers and multilevel interconnection that communicates with the respective circuit components, which are not shown for the sake of simplicity.

Inlaid copper contact pads 120a, 120b and 120c are formed at the top surface of the IC substrate 100. These inlaid copper contact pads are part of the top metal layer of the multilevel interconnection of the IC substrate 100 and is respectively electrically connected with the underlying integrated circuit. The inlaid copper contact pads 120a, 120b and 120c may be formed by conventional damascene process generally including the step of etching a trench opening into an insulating layer, filling the trench opening with copper, and then removing excess copper outside the trench opening by using a conventional chemical mechanical polishing (CMP) process.

A passivation layer 140 covers the top surface of the IC substrate 100. The inlaid copper contact pads 120a, 120b and 120c are exposed by openings 160a, 160b and 160c respectively, which are formed in the passivation layer 140. Typically, the openings 160, 160b and 160c have a dimension of about 0.5-15 micrometers. In another case, the diameter of the openings 160,160b and 160c may range between 15 and 300 micrometers.

The passivation layer 140 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc. The aforesaid silicon oxide may comprise organic oxide or inorganic oxide.

This preferred embodiment features the gold bonding structure 300a, gold pad-on-redistribution layer structure 300b and solder bump structure 300c, which are simultaneously fabricated on the IC substrate 100. The gold bonding structure 300a, gold pad-on-redistribution layer structure 300b and solder bump structure 300c are landed on the inlaid copper contact pads 120a, 120b and 120c, respectively.

The gold bonding structure 300b comprises an electrically conductive adhesion/barrier layer 180a that is directly bonded to the inlaid copper contact pad 120a and extends to the top surface of the passivation layer 140. The electrically conductive adhesion/barrier layer 180a, which contours the top surface of the passivation layer 140 and sidewalls of the opening 160a, seals the opening 160a and prevents the inlaid copper contact pad 120a from contacting with the air. Preferably, the electrically conductive adhesion/barrier layer 180a has a thickness ranging between 0.1 micrometer and 10 micrometers.

A first intermediate metal layer 132a is disposed on the electrically conductive adhesion/barrier layer 180a. According to this preferred embodiment, the first intermediate metal layer 132a is made of copper (>95% wt.). The first intermediate metal layer 132a has a thickness of about 0.1-10 micrometers. A second intermediate metal layer 122a is disposed on the first intermediate metal layer 132a. According to this preferred embodiment, the second intermediate metal layer 122a is made of nickel (>95% wt.). The second intermediate metal layer 122a has a thickness of about 0.1-10 micrometers. An electroless Au layer 190a is disposed on the second intermediate metal layer 122a. An Au bonding metal layer 200a is disposed on the electroless Au layer 190a.

The gold pad-on-redistribution layer structure 300b comprises an electrically conductive adhesion/barrier layer 180b that is directly bonded to the inlaid copper contact pad 120b and extends to the top surface of the passivation layer 140. The electrically conductive adhesion/barrier layer 180b, which contours the top surface of the passivation layer 140 and sidewalls of the opening 160b, seals the opening 160b and prevents the inlaid copper contact pad 120b from contacting with the air. Preferably, the electrically conductive adhesion/barrier layer 180b has a thickness ranging between 0.1 micrometer and 10 micrometers.

A first intermediate metal layer 132b is disposed on the electrically conductive adhesion/barrier layer 180b. The first intermediate metal layer 132b is made of copper (>95% wt.). The first intermediate metal layer 132b has a thickness of about 0.1-10 micrometers. A second intermediate metal layer 122b is disposed on the first intermediate metal layer 132b. The second intermediate metal layer 122b is made of nickel (>95% wt.). The second intermediate metal layer 122b has a thickness of about 0.1-10 micrometers. The electrically conductive adhesion/barrier layer 180b, first intermediate metal layer 132b and second intermediate metal layer 122b constitute a redistribution trace layer 280, which is an additional metal path for electrical interconnect on which the connections from the original contact pad 120b is redistributed over the surface of the passivation layer 140. An Au bonding metal layer 200b is disposed on the other end of the redistribution trace layer 280. Likewise, an electroless Au layer 190a is interposed between the Au bonding metal layer 200b and the second intermediate metal layer 122b.

The solder bump structure 300c comprises an electrically conductive adhesion/barrier layer 180c that is directly bonded to the inlaid copper contact pad 120c and extends to the top surface of the passivation layer 140. The electrically conductive adhesion/barrier layer 180c, which contours the top surface of the passivation layer 140 and sidewalls of the opening 160c, seals the opening 160c and prevents the inlaid copper contact pad 120c from contacting with the air. Preferably, the electrically conductive adhesion/barrier layer 180c has a thickness ranging between 0.1 micrometer and 10 micrometers.

A first intermediate metal layer 132c is disposed on the electrically conductive adhesion/barrier layer 180c. According to this preferred embodiment, the first intermediate metal layer 132c is made of copper (>95% wt.). The first intermediate metal layer 132c has a thickness of about 0.1-10 micrometers. A second intermediate metal layer 122c is disposed on the first intermediate metal layer 132c. According to this preferred embodiment, the second intermediate metal layer 122c is made of nickel (>95% wt.). The second intermediate metal layer 122c has a thickness of about 0.1-10 micrometers. A solder bump or post 250 is disposed on the second intermediate metal layer 122c.

The solder bump or post 250 may be jointed as chip, substrate, passive component such as capacitor or resist, or photodiode sensor, solar cell, etc. Preferably, the solder bump or post 250 comprises SnPb, SnAg, SnAgCu or Sn alloys. The solder bump or post 250 can be re-flowed as jointed.

Figure 9:
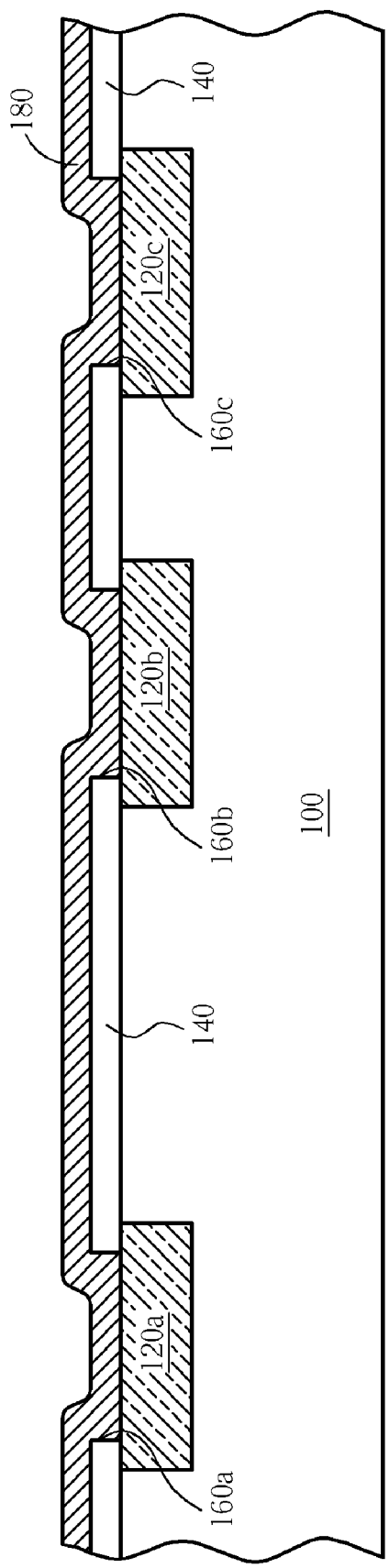
FIGS. 9-13 are schematic, cross-sectional diagrams illustrating a method for fabricating the structure shown in FIG. 8.

Please refer to FIGS. 9-13. FIGS. 9-13 are schematic, cross-sectional diagrams illustrating a method for fabricating the structure shown in FIG. 8. As shown in FIG. 9, an IC substrate 100 is provided. The IC substrate 100 comprises therein a plurality of circuit components such as, for example, transistors, memory and/or logic devices, dielectric layers and multilevel interconnection that communicates with the respective circuit components, which are not shown for the sake of simplicity.

Inlaid copper contact pads 120a, 120b and 120c are formed at the top surface of the IC substrate 100. These inlaid copper contact pads are part of the top metal layer of the multilevel interconnection of the IC substrate 100 and is respectively electrically connected with the underlying integrated circuit. The inlaid copper contact pads 120a, 120b and 120c may be formed by conventional damascene process generally including the step of etching a trench opening into an insulating layer, filling the trench opening with copper, and then removing excess copper outside the trench opening by using a conventional chemical mechanical polishing (CMP) process.

A passivation layer 140 covers the top surface of the IC substrate 100. The inlaid copper contact pads 120a, 120b and 120c are exposed by openings 160a, 160b and 160c respectively, which are formed in the passivation layer 140. Typically, the openings 160, 160b and 160c have a dimension of about 0.5-15 micrometers. In another case, the diameter of the openings 160, 160b and 160c may range between 15 and 300 micrometers. The passivation layer 140 may comprise silicon oxide, silicon nitride, silicon oxy-nitride, and a combination thereof, for example, silicon oxide/silicon nitride (ON), silicon oxide/silicon nitride/silicon oxide (ONO), silicon oxy-nitride/silicon oxide/silicon nitride/silicon oxide, silicon oxide/silicon nitride/silicon oxy-nitride/silicon oxide, etc.

An electrically conductive adhesion/barrier layer 180 is blanket deposited over the IC substrate 100. The electrically conductive adhesion/barrier layer 180 is directly bonded to the inlaid copper contact pads 120a, 120b and 120c and extends to the top surface of the passivation layer 140. The electrically conductive adhesion/barrier layer 180 contours the top surface of the passivation layer 140 and sidewalls of the openings 160a, 160b and 160c and seals the openings 160a, 160b and 160c. Preferably, the electrically conductive adhesion/barrier layer 180a has a thickness ranging between 0.1 micrometer and 10 micrometers.

According to this preferred embodiment, the electrically conductive adhesion/barrier layer 180 comprises titanium (Ti), tungsten (W), cobalt (Co), nickel (Ni), titanium nitride (TiN), titanium tungsten (TiW), vanadium (V), chrome (Cr), copper (Cu), CrCu, tantalum (Ta), tantalum nitride (TaN), or alloys thereof, or composite layer of the above-described materials. Thereafter, optionally, a seed layer (not shown) may be deposited over the electrically conductive adhesion/barrier layer 180.

Figure 10:
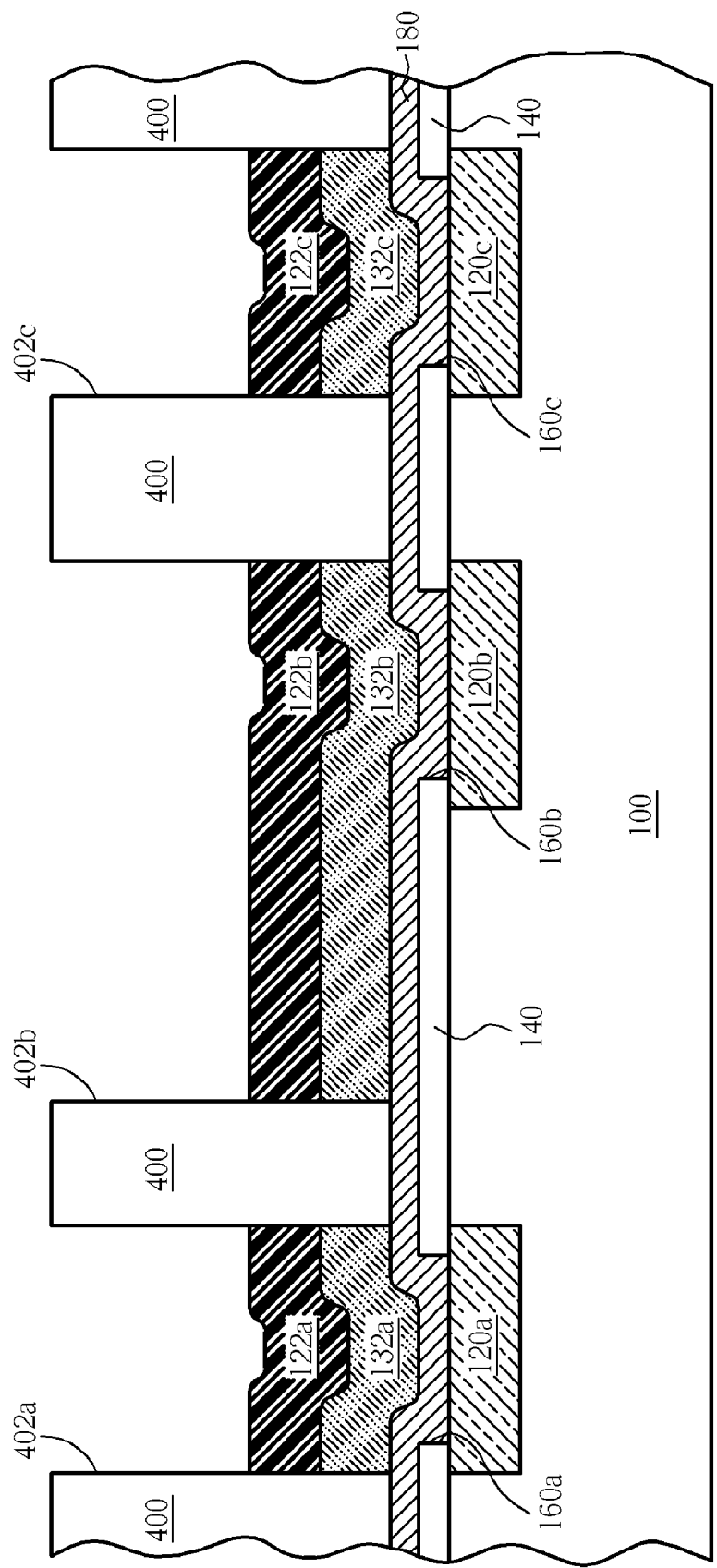

As shown in FIG. 10, a patterned photoresist layer 400 is formed on the electrically conductive adhesion/barrier layer 180. The patterned photoresist layer 400 is formed by conventional lithography methods generally including the steps of photoresist coating, baking, exposure and development. The photoresist may be a dry film. The patterned photoresist layer 400 has an opening 402a, opening 402b and opening 402c. The opening 402a is directly above the inlaid copper contact pad 120a. The opening 402b is directly above the inlaid copper contact pad 120b and defines a redistribution route. The opening 402c is directly above the inlaid copper contact pad 120c.

An electroplating process is carried out to plate copper layers 132a, 132b and 132c into the openings 402a, 402b and 402c, respectively. The thickness of the copper layers 132a, 132b and 132c ranges between 0.1 and 10 micrometers. In another case, the thickness of the copper layers 132a, 132b and 132c ranges between 10 and 250 micrometers. Subsequently, another electroplating process is carried out to plate nickel layers 122a, 122b and 122c into the openings 402a, 402b and 402c, respectively. As previously mentioned, the nickel layers 122a, 122b and 122c prevent surface oxidation of the underlying copper layer and it also acts as a strong barrier. The patterned photoresist layer 400 is then stripped off.

Figure 11:
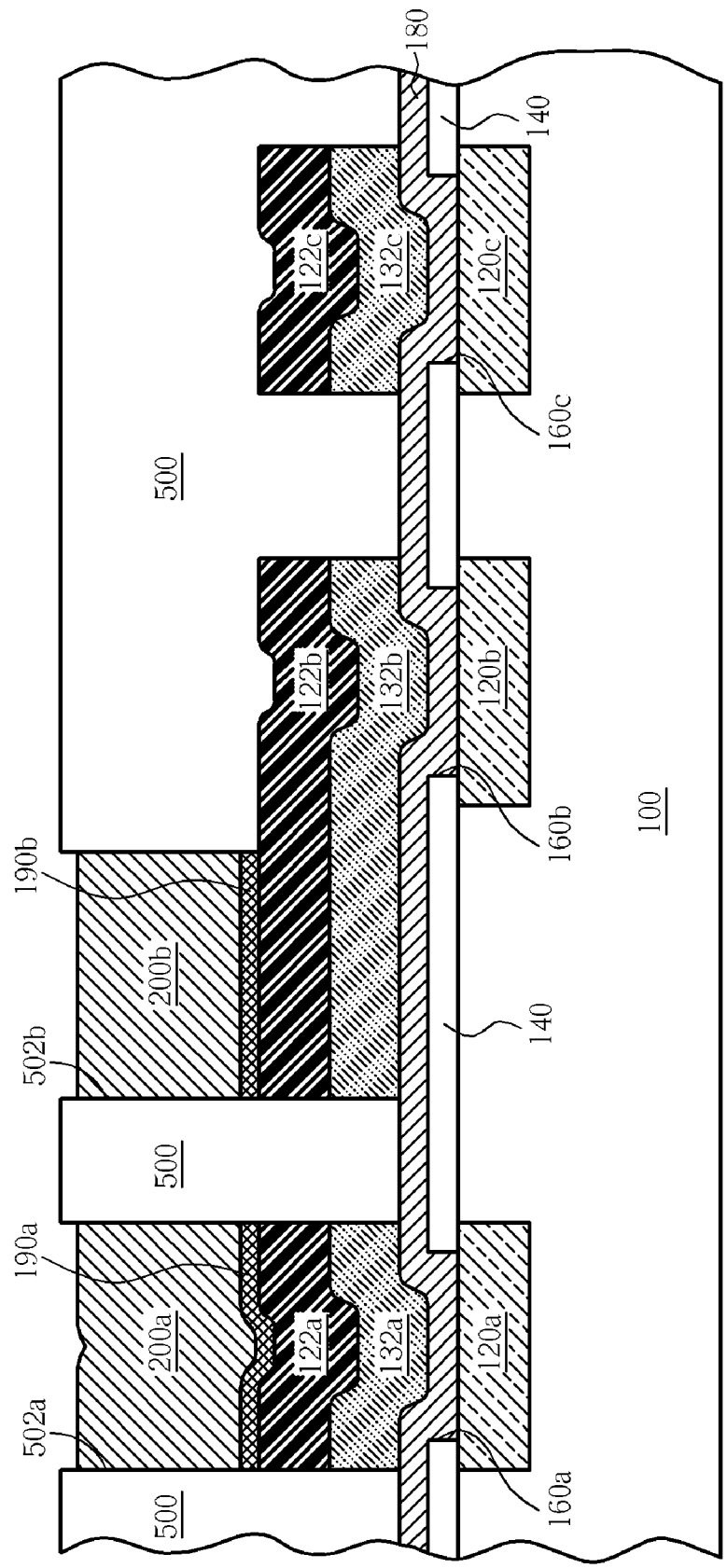

As shown in FIG. 11, another patterned photoresist layer 500 is formed on the IC substrate 100. The patterned photoresist layer 500 has an opening 502a that is directly above the inlaid copper contact pad 120a, and an opening 502b that is not directly above the inlaid copper contact pad 120b. The opening 502a exposes a top surface of the nickel layer 122a. The opening 502b exposes a pre-selected redistribution region of the nickel layer 122b. Electroless Au layers 190a and 190b are plated into the openings 502a and 502b, respectively. The electroless Au layers 190a and 190b are also optional. Thereafter, electroplating Au layers 200a and 200b are plated into the openings 502a and 502b, respectively. The patterned photoresist layer 500 is then removed.

Figure 12:
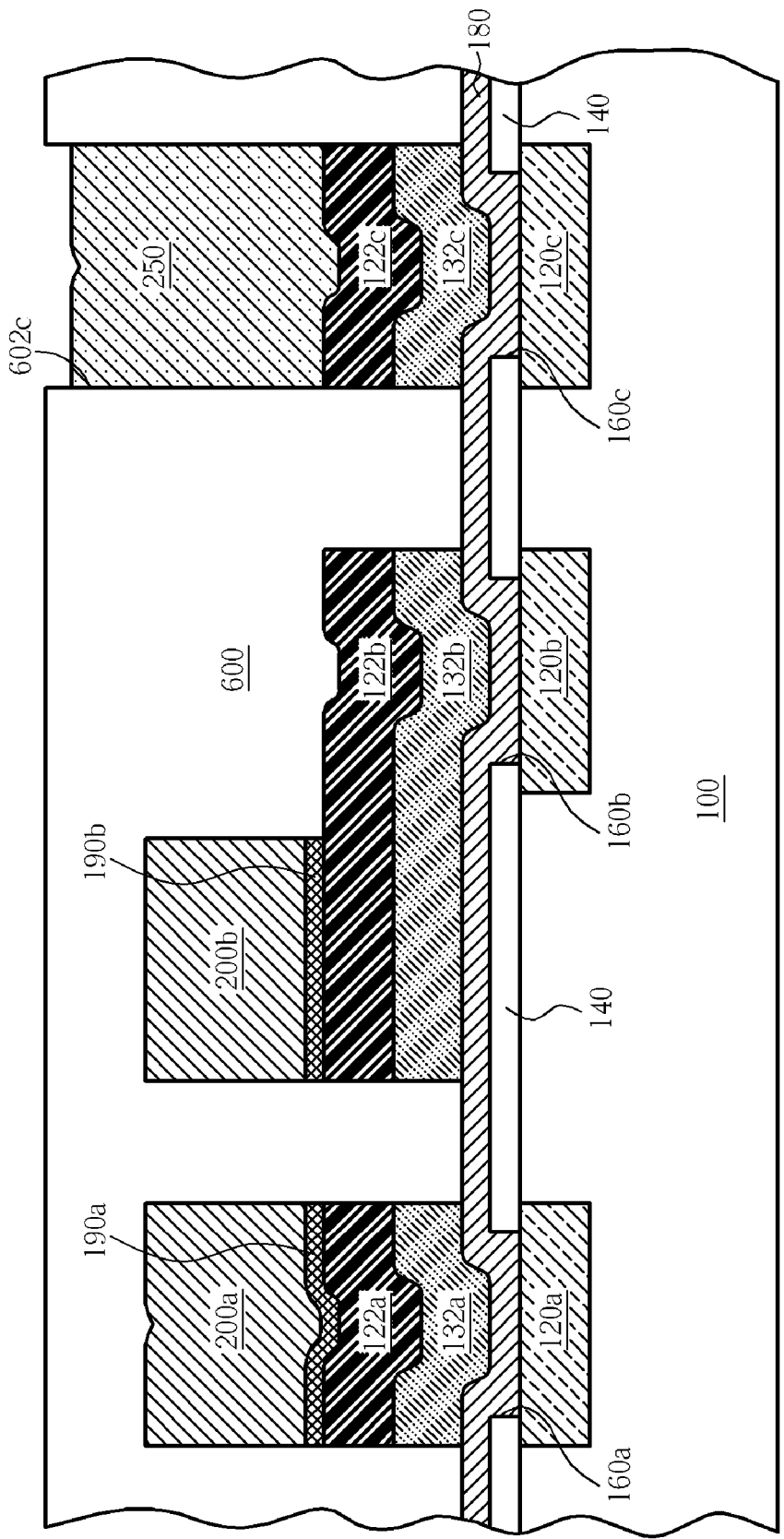

As shown in FIG. 12, another patterned photoresist layer 600 is formed on the IC substrate 100. The patterned photoresist layer 600 has an opening 602c that is directly above the inlaid copper contact pad 120c and exposes a top surface of the nickel layer 122c. A solder bump 250 is formed on the exposed nickel layer 122c in the opening 602c. The patterned photoresist layer 600 is then removed.

Figure 13:
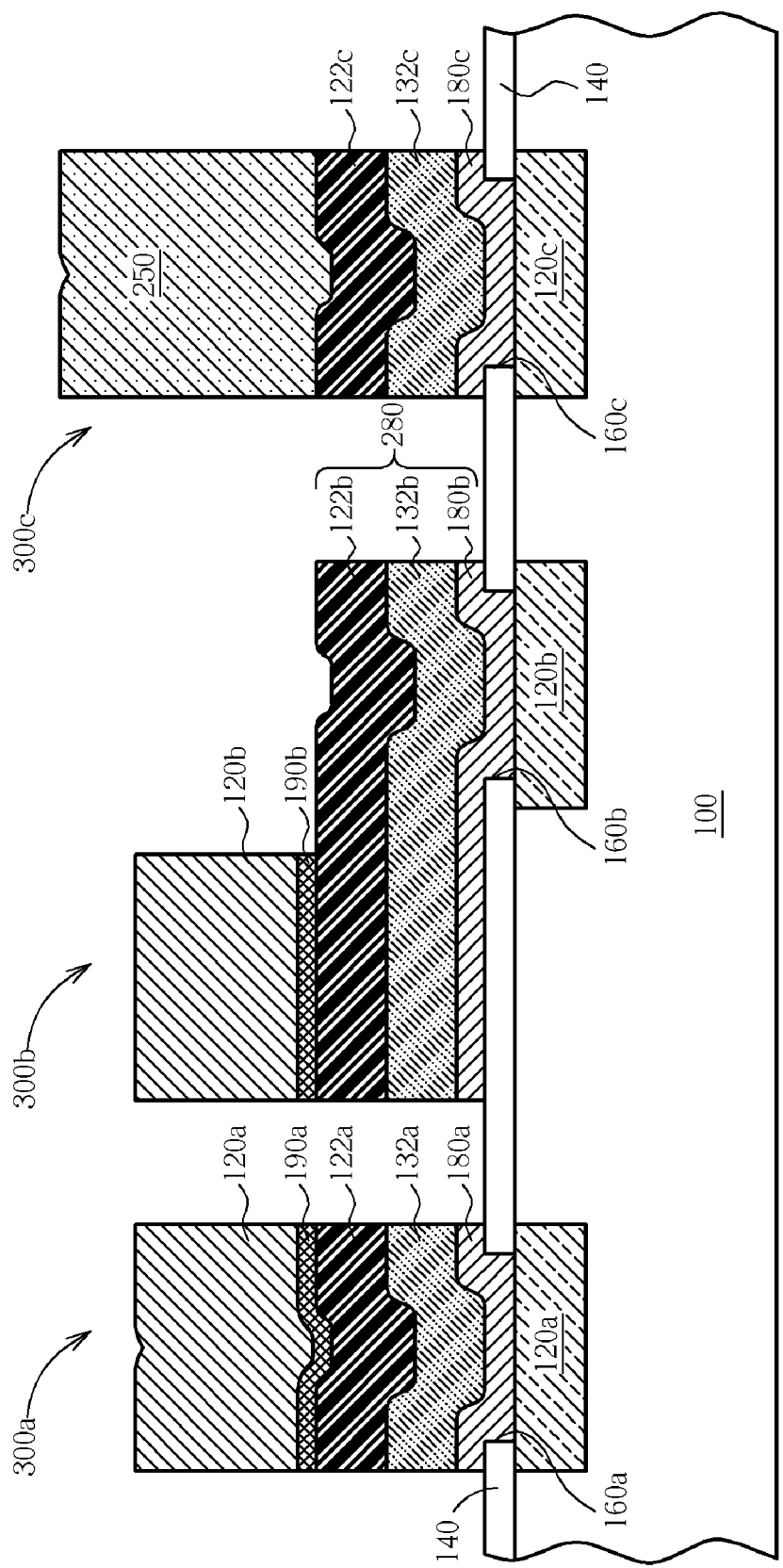

As shown in FIG. 13, after removing the patterned photoresist layer 600, an etching process is performed to removed the exposed electrically conductive adhesion/barrier layer 180, thereby forming electrically conductive adhesion/barrier layers 180a, 180b and 180c.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metallization structure of a semiconductor device comprising a transistor, comprising:
    a copper contact pad having a contact point at a bottom of an opening in an insulating layer of said semiconductor device, wherein said insulating layer comprises a nitride layer;
    a metal layer under said copper contact pad and at a sidewall of said copper contact pad;
    an aluminum-containing layer over said copper contact pad and vertically over said contact point;
    a first titanium-containing layer between said aluminum-containing layer and said copper contact pad and vertically over said contact point;
    a second titanium-containing layer on said aluminum-containing layer and vertically over said contact point; and
    a gold layer on said second titanium-containing layer and vertically over said contact point, wherein said gold layer has a top surface having no dielectric layer provided thereon and is configured for a chip-on-film (COF) bonding application.

2. The metallization structure of claim 1, wherein said gold layer comprises electroplated gold.

3. The metallization structure of claim 1, wherein said second titanium-containing layer comprises a titanium-tungsten alloy.

4. The metallization structure of claim 1, wherein said semiconductor device further comprises a memory device.

5. The metallization structure of claim 1, wherein said insulating layer further comprises an oxide layer.

6. The metallization structure of claim 1, wherein said nitride layer comprises silicon nitride.

7. The metallization structure of claim 1, wherein said nitride layer comprises silicon oxynitride.

8. The metallization structure of claim 1, wherein said opening has a dimension between 0.5 and 15 μm.

9. A metallization structure of a semiconductor device comprising a transistor, comprising:
    a copper contact pad having a contact point at a bottom of an opening in an insulating layer of said semiconductor device, wherein said insulating layer comprises a nitride layer;
    a metal layer under said copper contact pad and at a sidewall of said copper contact pad;
    an aluminum-containing layer over said copper contact pad and vertically over said contact point;
    a tantalum-containing layer between said aluminum-containing layer and said copper contact pad and vertically over said contact point;
    a titanium-containing layer on said aluminum-containing layer and vertically over said contact point; and
    a gold layer on said titanium-containing layer and vertically over said contact point, wherein said gold layer has a top surface having no dielectric layer provided thereon and is configured for a chip-on-film (COF) bonding application.

10. The metallization structure of claim 9, wherein said gold layer comprises electroplated gold.

11. The metallization structure of claim 9, wherein said titanium-containing layer comprises a titanium-tungsten alloy.

12. The metallization structure of claim 9, wherein said semiconductor device further comprises a memory device.

13. The metallization structure of claim 9, wherein said insulating layer further comprises an oxide layer.

14. The metallization structure of claim 9, wherein said nitride layer comprises silicon nitride.

15. The metallization structure of claim 9, wherein said nitride layer comprises silicon oxynitride.

16. The metallization structure of claim 9, wherein said opening has a dimension between 0.5 and 15 μm.

17. A metallization structure of a semiconductor device comprising a transistor, comprising:
    a copper contact pad having a contact point at a bottom of an opening in an insulating layer of said semiconductor device, wherein said insulating layer comprises a nitride layer;
    a metal layer under said copper contact pad and at a sidewall of said copper contact pad;
    an aluminum-containing layer over said copper contact pad and vertically over said contact point;
    a first titanium-containing layer between said aluminum-containing layer and said copper contact pad and vertically over said contact point;
    a second titanium-containing layer on said aluminum-containing layer and vertically over said contact point; and
    a gold layer on said second titanium-containing layer and vertically over said contact point, wherein said gold layer has a top surface having no dielectric layer provided theron, and said gold layer is configured for a chip-on-glass (COG) bonding application.

18. The metallization structure of claim 17, wherein said gold layer comprises electroplated gold.

19. The metallization structure of claim 17, wherein said second titanium-containing layer comprises a titanium-tungsten alloy.

20. The metallization structure of claim 17, wherein said semiconductor device further comprises a memory device.

21. The metallization structure of claim 17, wherein said insulating layer further comprises an oxide layer.

22. The metallization structure of claim 17, wherein said nitride layer comprises silicon nitride.

23. The metallization structure of claim 17, wherein said nitride layer comprises silicon oxynitride.

24. The metallization structure of claim 17, wherein said opening has a dimension between 0.5 and 15 µm.

25. A metallization structure of a semiconductor device comprising a transistor, comprising:
   a copper contact pad having a contact point at a bottom of an opening in an insulating layer of said semiconductor device, wherein said insulating layer comprises a nitride layer;
   a metal layer under said copper contact pad and at a sidewall of said copper contact pad;
   an aluminum-containing layer over said copper contact pad and vertically over said contact point;
   a tantalum-containing layer between said aluminum-containing layer and said copper contact pad and vertically over said contact point;
   a titanium-containing layer on said aluminum-containing layer and vertically over said contact point; and
   a gold layer on said titanium-containing layer and vertically over said contact point, wherein said gold layer has a top surface having no dielectric layer provided theron, and said gold layer is configured for a chip-on-glass (COG) bonding application.

26. The metallization structure of claim 25, wherein said gold layer comprises electroplated gold.

27. The metallization structure of claim 25, wherein said titanium-containing layer comprises a titanium-tungsten alloy.

28. The metallization structure of claim 25, wherein said semiconductor device further comprises a memory device.

29. The metallization structure of claim 25, wherein said insulating layer further comprises an oxide layer.

30. The metallization structure of claim 25, wherein said nitride layer comprises silicon nitride.

31. The metallization structure of claim 25, wherein said nitride layer comprises silicon oxynitride.

32. The metallization structure of claim 25, wherein said opening has a dimension between 0.5 and 15 µm.

* * * * *